(12) United States Patent
Blanchard

(10) Patent No.: US 7,442,584 B2
(45) Date of Patent: Oct. 28, 2008

(54) ISOLATED VERTICAL POWER DEVICE STRUCTURE WITH BOTH N-DOPED AND P-DOPED TRENCHES

(75) Inventor: Richard Austin Blanchard, Los Altos, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 421 days.

(21) Appl. No.: 11/284,979

(22) Filed: Nov. 21, 2005

(65) Prior Publication Data

US 2007/0117360 A1    May 24, 2007

(51) Int. Cl.
H01L 21/332    (2006.01)
(52) U.S. Cl. .................. 438/137; 438/133; 438/139; 257/E21.388
(58) Field of Classification Search .............. 438/133, 438/137, 138, 139; 257/E21.388
See application file for complete search history.

(56) References Cited

U.S. PATENT DOCUMENTS

| | | | |
|---|---|---|---|
| 4,791,073 A | 12/1988 | Nagy et al. | |
| 5,557,134 A | 9/1996 | Sugisaka et al. | |
| 6,579,782 B2 | 6/2003 | Roy | |
| 6,734,476 B2* | 5/2004 | Moessner et al. | 257/289 |
| 6,759,726 B1 | 7/2004 | Anceau et al. | |
| 6,784,465 B2 | 8/2004 | Roy | |
| 7,256,470 B2* | 8/2007 | Bui et al. | 257/461 |
| 2003/0085431 A1* | 5/2003 | Shenoy | 257/394 |

* cited by examiner

*Primary Examiner*—Scott B. Geyer
*Assistant Examiner*—Seahvosh J Nikmanesh
(74) *Attorney, Agent, or Firm*—Lisa K. Jorgenson; Bruce Terry

(57) ABSTRACT

A method for manufacturing an isolated vertical power device includes forming, in a back surface of a first conductivity type substrate, back isolation wall trenches that surround a conduction region of the device. In a front surface of the substrate, front isolation wall trenches are formed around the conduction region. Thereafter, a film containing a second type dopant is deposited in the front and back isolation wall trenches. In the conduction region on the back surface, conduction region trenches are formed inside the perimeter of the isolation wall trenches. A first type dopant is deposited in the conduction region trenches. The dopants are diffused from the conduction region trenches and isolation wall trenches to form a first conductivity type conduction region structure and a second conductivity type isolation wall.

22 Claims, 7 Drawing Sheets

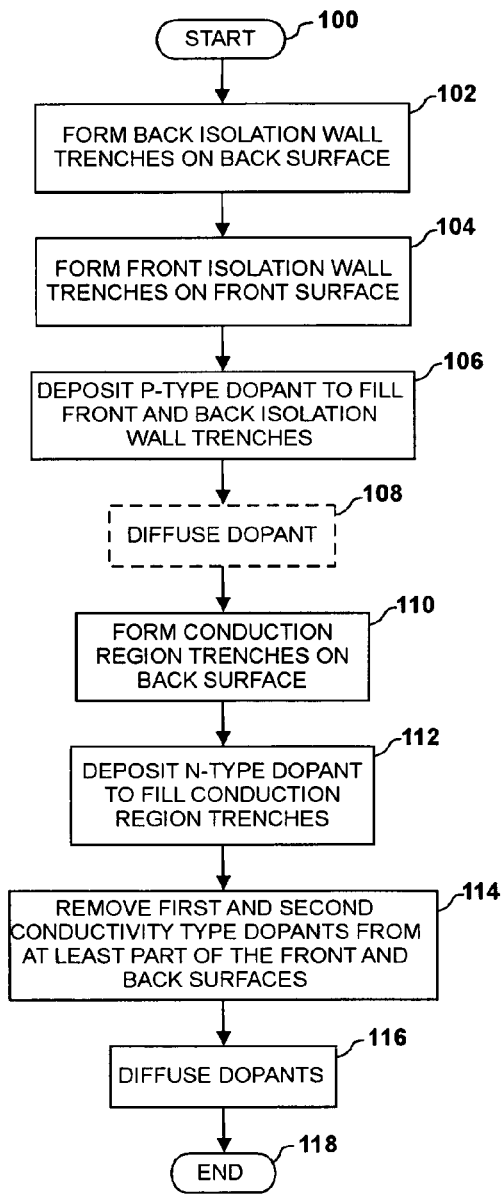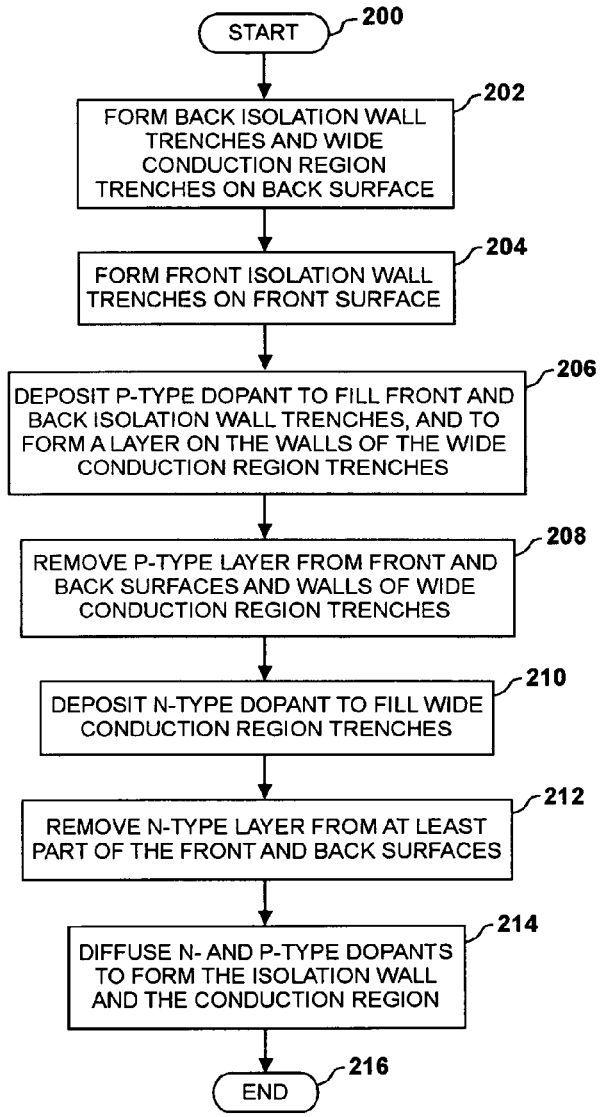
Fig. 2
Fig. 3

ISOLATED VERTICAL POWER DEVICE STRUCTURE WITH BOTH N-DOPED AND P-DOPED TRENCHES

BACKGROUND OF THE INVENTION

1. Field of the Invention

The present invention relates in general to semiconductor devices, and more particularly to a means and method for providing a vertical power device having an insulating isolation wall for electrically isolating one device from another, and having a low resistance path to the conduction region of the device.

2. Description of the Prior Art

A vertical power semiconductor is an electronic device used to control the flow of electrical power. When a vertical power semiconductor device is fabricated in a semiconductor substrate, the device usually requires electrical isolation from other regions of the substrate. The purpose of such isolation is to separate the vertical power device from other components on the same chip or wafer, or to create an electrically inactive protection area at the border of the device, where the several devices or chips on a wafer may be cut apart from one another.

One solution to the problem of isolating vertical power devices is described in U.S. Pat. No. 6,579,782 (the '782 patent) issued to Roy on Jun. 17, 2003, which is hereby incorporated herein by reference. The '782 patent describes a method for manufacturing a four-layer vertical power component, such as the four-layer thyristor shown in the simplified cross-sectional view of FIG. 1 herein. A thyristor is an electronic device used to control the flow of electrical power. It is similar to a diode, but it has an extra terminal for receiving a signal that places the device in a conductive state. The thyristor is formed in a silicon semiconductor substrate 20 that is lightly doped with an N-type dopant. It has a four-layer structure consisting of alternating P-type and N-type materials (e.g., PNPN). The thyristor is surrounded at its external periphery with an isolating wall, which is formed with a material of a conductivity type opposite to that of the substrate.

Manufacturing the prior art thyristor begins with the step of forming, on the lower surface 22 of the substrate, a succession of holes 24 perpendicular to the surface. Some of the holes—the holes around a perimeter of a conduction region—form a lower portion of an isolation wall. The holes within the perimeter form the conduction region. Next, a dopant having a second conductivity type, which is opposite to that of the substrate, is diffused from both types of holes. Further steps include: boring similar holes 26 on the upper surface 28 of the substrate to define an upper portion of the isolating wall; and diffusing, from holes 26 a dopant of the second conductivity type with a high doping level, wherein the holes 24 and 26 of to the isolating wall are sufficiently close for the diffused areas to join laterally and vertically.

In the prior art, the same type of dopant is diffused from both isolation wall holes and conduction region holes. This process works fine for making four-layer devices, but an improved process is needed for making other devices, such as bipolar transistors and power MOSFETs. Such three-layer devices require isolation walls having a second conductivity type, and a conduction region having a first conductivity type.

BRIEF DESCRIPTION OF THE DRAWINGS

For a more complete understanding of the present invention, and the advantages thereof, reference is now made to the following descriptions taken in conjunction with the accompanying drawings, in which like numbers designate like parts, and in which:

FIG. 2 is a high-level flowchart of a first embodiment of a method of manufacturing a vertical power device on a semiconductor substrate in accordance with the method and apparatus of the present invention;

FIG. 3 is a high-level flowchart of a second embodiment of a method of manufacturing a vertical power device in accordance with the present invention;

DESCRIPTION OF THE PREFERRED EMBODIMENTS

The process steps and structures described below may not form a complete process flow for manufacturing an integrated circuit device because the present invention can be practiced in conjunction with integrated circuit fabrication techniques currently used in the art. Of the commonly practiced process steps for manufacturing an integrated circuit device, only those steps necessary for an understanding of the present invention are described herein. The figures representing cross-section views of portions of an integrated circuit device during fabrication are not drawn to scale, but are instead drawn to illustrate the important features and processes of the present invention.

Figure 4:
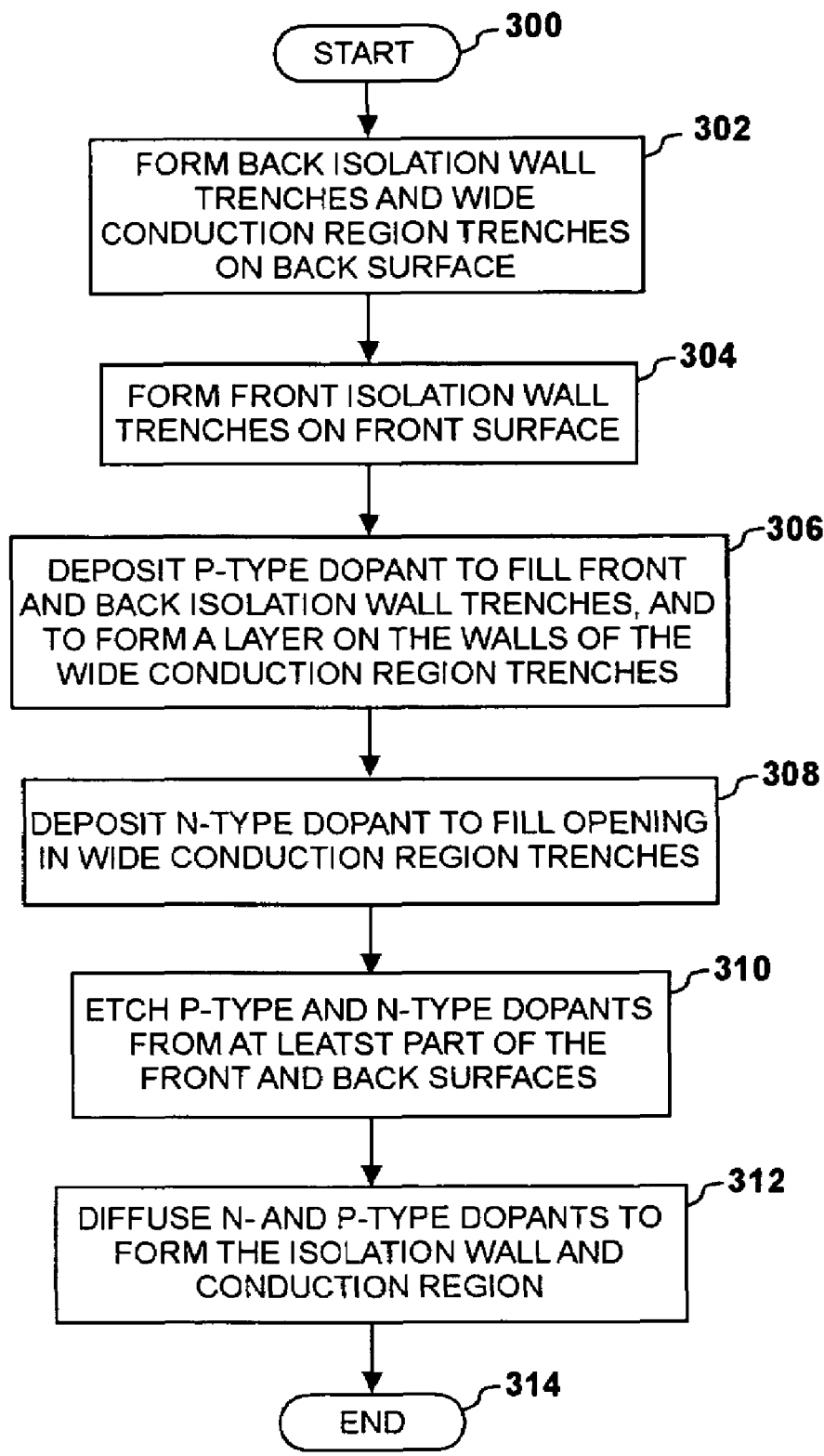
FIG. 4 is a high-level flowchart of a third embodiment of a method for manufacturing a vertical power device in accordance with the present invention.

With reference now to the drawings, FIGS. 2-4 illustrate high-level flowcharts of three embodiments of methods for manufacturing an isolated vertical power device on a semiconductor substrate in accordance with the present invention. The devices manufactured by the methods of the present invention are three-layer devices consisting of three layers of alternating P- and N-type material. The types of devices manufactured according to the present invention include bipolar-based devices and MOSFET-based devices. FIGS. 5-16 illustrate corresponding physical results of the various steps of these methods. In the description that follows, the manufacturing steps are described with reference to a particular block in a flowchart. Following the description of the manufacturing step is a description of a corresponding figure that best illustrates the physical results of that flowchart step.

The flowchart in FIG. 2 depicts a first embodiment of a method for manufacturing an isolated vertical power device in a semiconductor substrate in accordance with the present invention. As illustrated, the process begins at block 100, and thereafter passes to block 102, wherein back isolation wall trenches are formed in a back surface of a semiconductor substrate having a first conductivity type.

Figure 1:
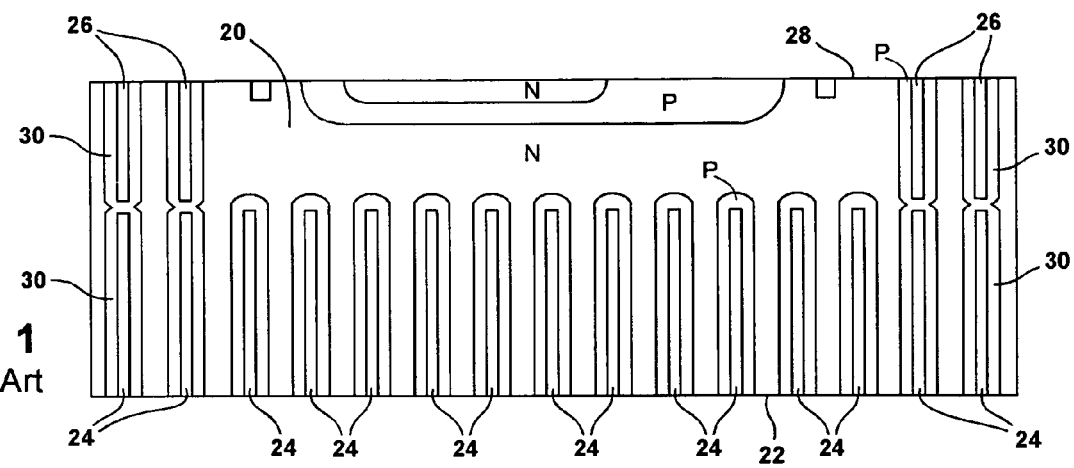
FIG. 1 is a simplified cross-section view of a prior art vertical power device.
Figure 5:
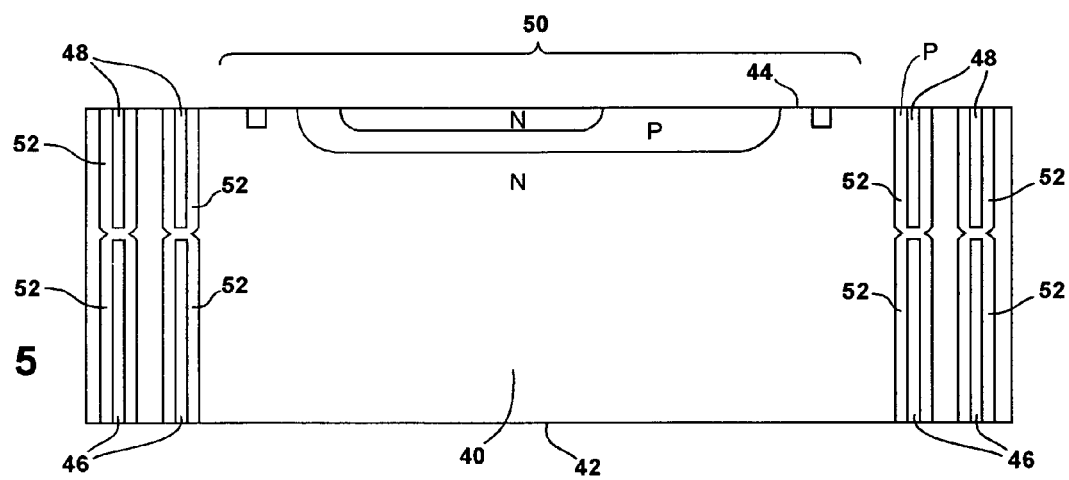
FIGS. 5 and 6 are simplified cross-section views of a vertical power device in various stages of manufacturing in accordance with the first embodiment of the present invention.

This step of forming back isolation wall trenches is illustrated in FIG. 5, which shows substrate 40 having back surface 42 and front surface 44. Back isolation wall trenches 46 have been formed in back surface 42.

In the examples of the embodiments illustrated in the figures, the vertical power device is manufactured in an N-type substrate 40, which may be referred to herein as a "substrate having a first conductivity type." The phrases "first conductivity type" and "second conductivity type" are used in this description because N- and P-type dopants (and other similarly polarized materials used in semiconductor manufacturing) may be exchanged to make a complimentary device having an opposite polarity.

Substrate 40 is typically a wafer of semiconductor material, such as silicon, which is large enough for concurrently manufacturing hundreds of similar devices, or hundreds of circuits containing such vertical power devices. Back isolation wall trenches 46 are arranged to surround a perimeter of a "conduction region" of the vertical power device. This is illustrated in the plan view of FIG. 13, which shows that back isolation wall trench 46 may be a continuous trench on back surface 42 of substrate 40, which forms a closed shape around a perimeter of conduction region 50. The "conduction region," or "active region," of the vertical power device may be defined as the region extending vertically through the substrate that is occupied by switching structures of the device, which is the region through which switched power passes.

Any one of several well known processes may be used to form the back isolation wall trenches. In a preferred embodiment, the trench is formed by a dry etching process, such as "dry plasma etching," which is well known in the art of semiconductor manufacturing. Dry plasma etching is a physical and chemical etching process that uses reactive ionized gas to remove unprotected portions of a layer of material, such as the substrate, to leave an opening, or recess, which may be referred to as a "trench." The process of etching a trench may be generally referred to as "forming," "etching," or "boring" a trench.

Referring back to FIG. 2, the next step in the process is forming front isolation wall trenches on the front surface of the semiconductor substrate, as illustrated in block 104. This step is preferably implemented with an etching process similar to that discussed above in reference to block 102. Formation of the front isolation wall trenches is shown in FIG. 5, where front isolation wall trenches 48 are formed in upper surface 44 of substrate 40. Front isolation wall trenches 48 similarly surround the perimeter of conduction region 50.

Note that back isolation wall trenches 46 and front isolation wall trenches 48 in FIG. 5 are formed on opposite sides of substrate 40, and that each are formed to a depth in substrate 40 that does not overlap the depth of the other. In other words, if back trench 46 and front trench 48 were formed along the same vertical axis, the trench openings would not meet or connect. Their depths would fall short of producing an opening that passes all the way through substrate 40. Thus, in a preferred embodiment, the sum of the depths of back trench 46 and front trench 48 does not exceed the thickness of substrate 40.

The locations of back isolation wall trenches 46 on back surface 42 are preferably mirrored by front isolation wall trenches 48 on front surface 44. (Note that front surface 44 is not shown in a plan view in the figures.) Thus, the patterns and shapes shown in the figures for back isolation wall trenches 46 are preferably substantially repeated on front surface 44 of substrate 40 in forming front isolation wall trenches 48.

Figure 12:
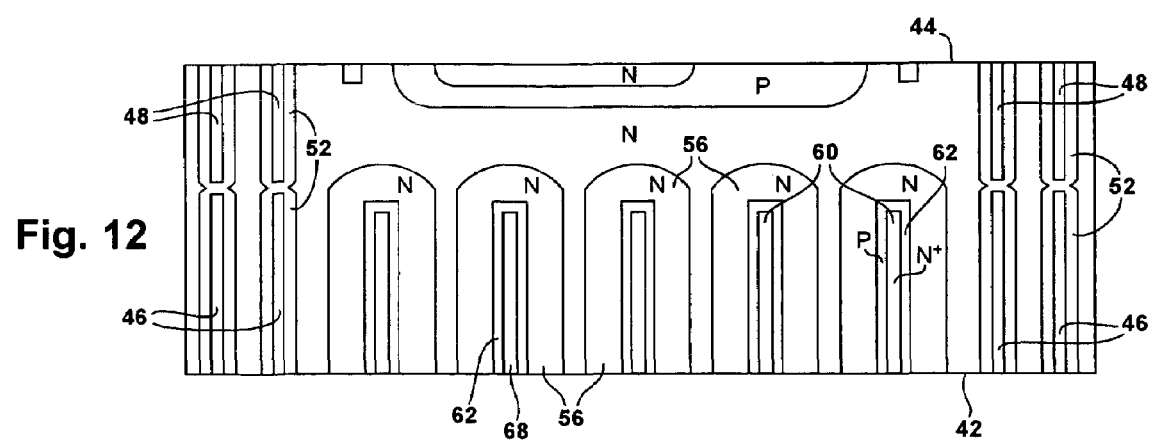
Figure 13:
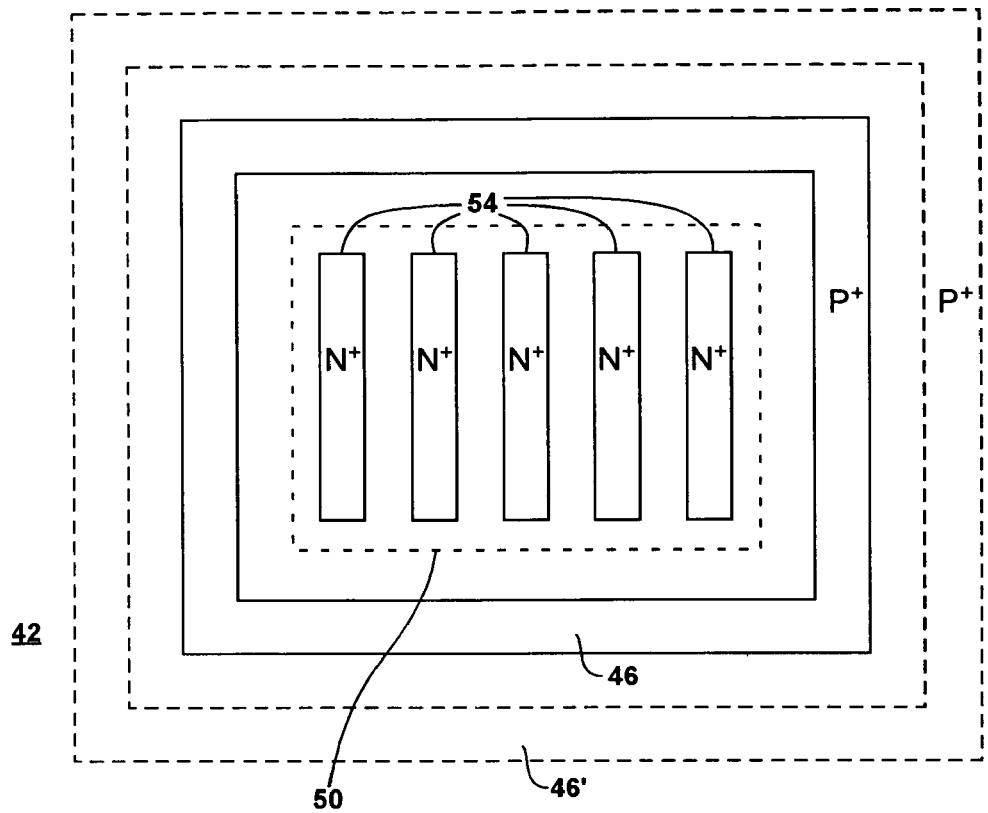
FIGS. 13-16 are partial views of a back surface of a semiconductor substrate showing various examples of structures used in manufacturing the vertical power device according to the present invention.

More than one isolation wall trench may be used to surround conduction region 50. The reason for using more than one trench is to make sure that the isolation wall trenches do not remove so much silicon that the wafer is weakened, or becomes susceptible to warping. Thus, two continuous trenches 46 and 46' are shown in FIG. 13, where both of the trenches concentrically surround conduction region 50. In the cross-sectional views of FIGS. 5-12, two isolation wall trenches are shown, wherein they are represented by pairs of inner and outer trenches on both the right and left sides of substrate 40.

After forming back and front isolation wall trenches, the next step in the process of FIG. 2 is depositing P-type dopant to fill the front and back isolation wall trenches, as depicted in block 106. In the particular example shown in FIG. 5, P-type material has been deposited to fill back isolation wall trenches 46 and front isolation wall trenches 48. Note that the conductivity type of the dopant used to fill the isolation wall trenches is the type opposite of the conductivity type used for the substrate.

Depositing the P-type dopant is preferably implemented with a chemical vapor deposition technique, which is well known in the art of semiconductor processing. The P-type dopant may be one of several known dopants, including, but not limited to, boron, indium, or aluminum. The P-type dopant may be present in a dielectric material such as doped silicon dioxide, or in a conductive material such as doped poly silicon.

In the present invention, it is important to fill front and back isolation wall trenches 48 and 46 with deposited dopant material. Therefore, the type of deposition selected, and the specific deposition parameters (e.g., time, temperature, etc . . . ), should be based upon the dimensions of the front and back isolation wall trenches 48 and 46. For example, the smallest dimension across the trench (i.e., the trench width) should be a distance that allows deposited material to completely fill the trench opening rather than just depositing a layer that outlines or coats the sidewalls of the trench. That is, during the deposition process, the layers being deposited and accumulating on opposing sidewalls must grow together and close any gap, thereby completely filling the trench.

Figure 7:
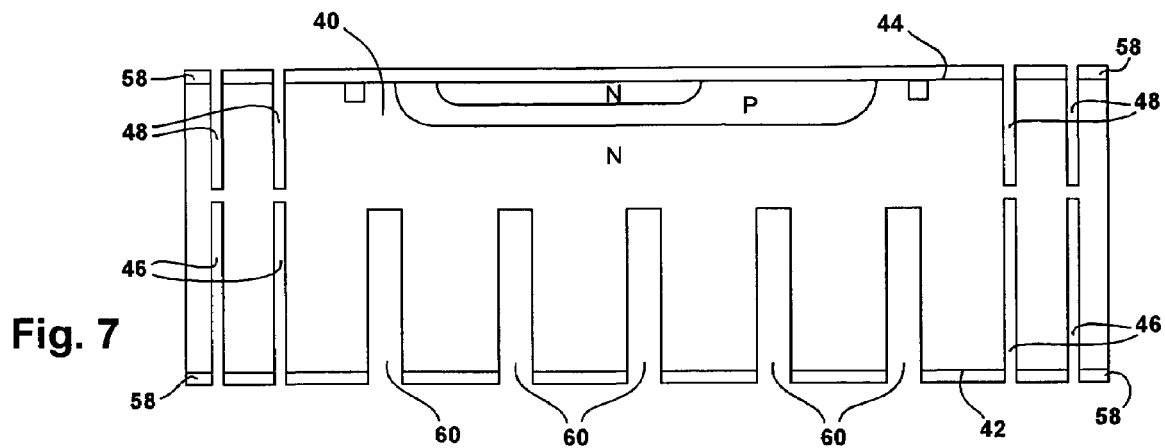
FIGS. 7-10 are simplified cross-section views of a vertical power device in various stages of manufacturing in accordance with the second embodiment of the present invention.
Figure 8:
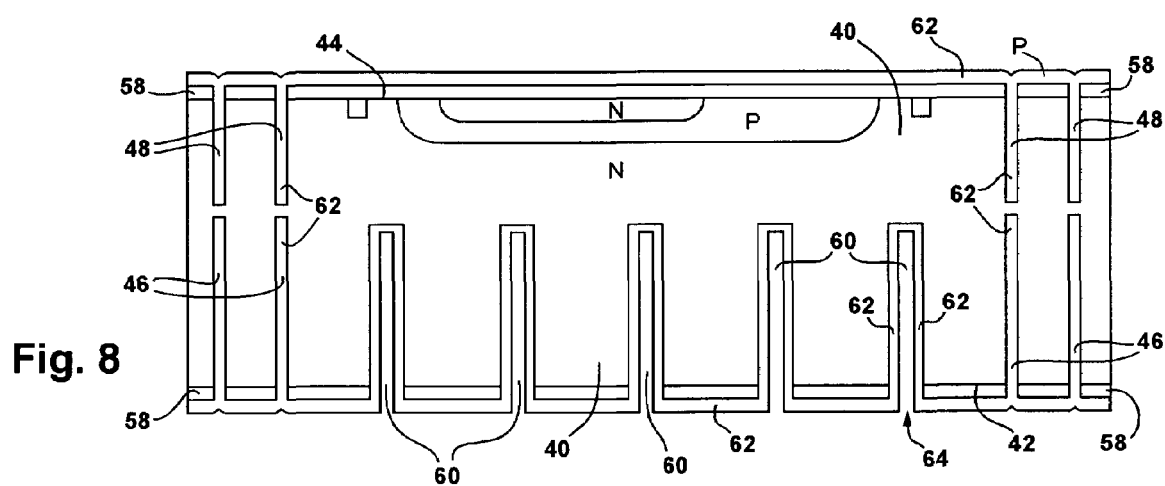

After depositing the P-type dopant, it may be removed from the substrate surface using either an etch or a polish step, but it does not need to be removed if the front and back surfaces 44 and 42 are protected from being covered by dopant with a layer of material such as silicon dioxide. For example, in the processes described herein, insulating layers of oxide, or oxide/nitride (which may be referred to in the art as a "sandwich") may be applied to the front and back surfaces of the substrate to aid in forming and otherwise manufacturing the trenches and other features of the vertical power device. Such a sandwich layer, or dielectric layer 58, is shown in FIGS. 7 and 8. Steps described herein that describe removing material from the front or back surfaces of the substrate are intended to include removing material from dielectric layer 58, if such a layer is present.

Returning to the process shown in FIG. 2, the next step, which is an optional step, is diffusing the deposited P-type dopant, as illustrated at block 108. Diffusion is a high-temperature process in which desired chemicals (e.g., a dopant) on a wafer are distributed within the silicon substrate to form a device component. In the present invention, this optional diffusion step redistributes the P-type dopant from the front and back isolation wall trenches to form an isolation wall within the N-type substrate. This step is optional because diffusing the dopant in the isolation wall trenches may be performed during a diffusion step (step 116) later in the process.

The diffusion process is illustrated in FIG. 5 by diffused regions 52 that surround both back isolation wall trenches 46 and front isolation wall trenches 48. Note that diffused regions 52 have merged together, or intersected, vertically, near the deepest or furthest extents of trenches 46 and 48, which are near the medial plane of substrate 40. If segmented isolation wall trenches are used, the diffused regions will also merge, or intersect, horizontally. When the process is completed, the intersection of the diffused regions forms a continuous vertical diffused region 52 that extends from back surface 42 to front surface 44, around conduction region 50. If the conditions (e.g., time and temperature) of the optional diffusion step 108 are not sufficient to cause the diffusion regions 52 to intersect, a second diffusion step at block 116 may be used to further diffuse material in the isolation wall trenches and close the gaps in the diffusion areas that form the isolation wall.

Referring again to FIG. 2, the next step in the process is forming conduction region trenches on the back surface of the substrate located inside a perimeter of the front and back isolation wall trenches, as depicted at block 110. According to this first embodiment of the present invention, conduction region trenches are formed in an etching step separate from the etching of the isolation wall trenches so that the conduction region trenches may be filled with a type of dopant that is different from the type of dopant used to fill the isolation walls. This second etching step is preferably implemented using a plasma etching technique, similar to that described above in reference to blocks 102 and 104 for forming isolation wall trenches.

The conduction region trenches are trenches used for creating more heavily doped regions in the vertical power device in the region of the semiconductor substrate that conducts the electric current that is controlled by the vertical power device. For example, the conduction region trenches on the back surface of the substrate of a MOSFET form the drain contact structure.

Figure 6:
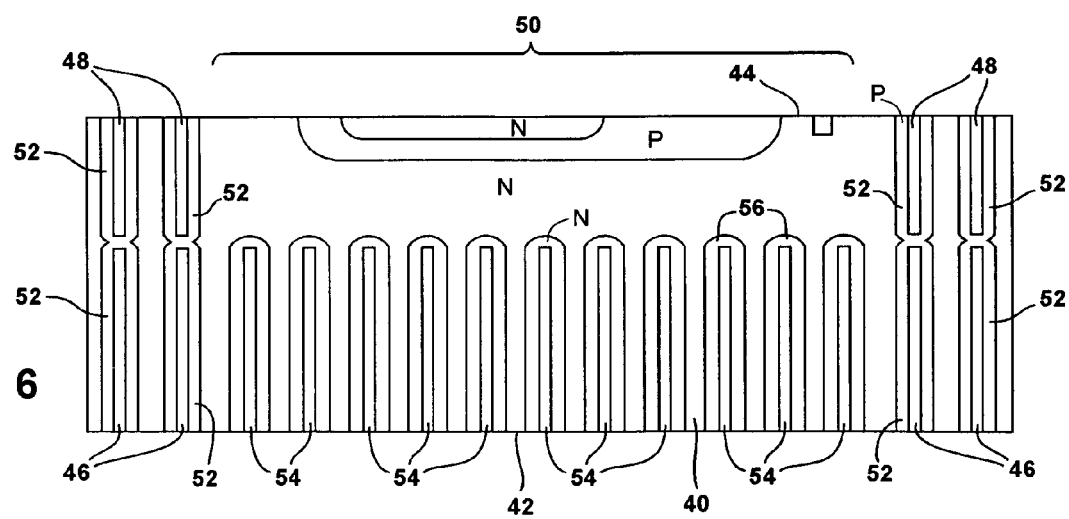

FIG. 6 shows a placement of a plurality of conduction region trenches 54 on back surface 42 of substrate 40. In the embodiment depicted in FIG. 6, the size, or width, of conduction region trenches 54 may be substantially the same as that of isolation wall trenches 46 and 48. Alternatively, conduction region trenches 54 may have a size, shape, or depth that is different from what is used in isolation wall trenches 46 and 48.

FIG. 13 shows a plan view of the placement of conduction region trenches 54. Conduction region trenches 54 are located within a perimeter of the back (and front) isolation wall trenches 46 and 46' to form a conduction region 50.

Returning to FIG. 2, after forming the conduction region trenches, N-type dopant is deposited to fill the conduction region trenches, as illustrated in block 112. This step may be implemented with a deposition process, such as vapor phase deposition, which is similar to the process described above in relation to block 106, where dopant is deposited in the isolation wall trenches. The N-type dopant may be any one of several known dopants, including, but not limited to, phosphorous, arsenic, and antimony.

Note that N-type dopant is used to fill conduction region trenches 54 in N-type substrate 40 because the present invention includes a method for manufacturing a three-layer vertical power device, and therefore the dopant filling conduction region trenches 54 has the same polarity or type as that of substrate 40.

Also notice that the P-type dopant that was previously deposited to fill isolation wall trenches 46 and 48 (see block 106) acts as a barrier to keep the presently deposited N-type dopant out of the isolation wall trenches.

After depositing the N-type dopant, the next step in the process is to remove the first and second conductivity type dopants from at least part of the front and back surfaces, as depicted at block 114 in FIG. 2. Removing the dopants prevents the diffusion of P- or N-type materials into the surfaces of substrate 40. The dopants are preferably removed by a known etching process, such as a wet or a plasma etch, or alternatively, by a polish operation. (Note that the front and back surfaces of the wafer may have a dielectric layer or dielectric sandwich present.)

The N-doped layer can be left on a bare back surface. If it is left, the N-type dopant also dopes the back surface.

The next step in the process is diffusing the dopants, as depicted at block 116 in FIG. 2. In FIG. 6, diffusions from isolation wall trenches 46 and 48 are shown as isolation wall diffused regions 52. Diffusions from conduction region trenches 54 are shown as conduction region diffused regions 56.

As mentioned above, this diffusion step may be the only diffusion step in the process. Or, if an optional diffusion step has already been performed, this step 116 will diffuse dopant in conduction region trenches 54 and further diffuse dopants in isolation wall trenches 46 and 48. In either case, this step will diffuse both the N-type dopant in the conduction region trenches and the P-type dopant in the isolation wall trenches.

Diffusion step 116 is carried on under conditions (e.g., for a length of time at a specific temperature) that are sufficient for the isolation wall diffusing regions 52 to extend from the isolation wall trenches formed on one surface to join or intersect regions diffusing from trenches on the opposite surface, and for any diffusing regions in adjacent isolation wall trenches on the same surface to join or intersect horizontally. With regard to diffusion from the conduction region trenches 54, the diffused regions 56 do not need to join or intersect in order to provide a more heavily doped conductive path to the back surface of the device.

While there are typically other steps needed to complete the fabrication of a vertical power device, and such additional steps may be interspersed in the flowchart of FIG. 2, the steps of this first embodiment of the present invention end at block 118.

With reference now to FIG. 3, there is depicted a high-level flowchart of a second embodiment of method of manufacturing an isolated vertical power device in accordance with the present invention. As illustrated, the process begins at block 200, and thereafter passes to block 202 wherein back isolation wall trenches and wide conduction region trenches are formed on the back surface of the substrate. In this embodiment, these isolation wall and conductivity region trenches may be formed using an etching process, such as that described above with reference to block 102 in FIG. 2.

As shown on the back of substrate 40 in FIG. 7, wide conduction region trenches 60 are wider than the isolation wall trenches 46. For example, isolation wall trenches 46 may have a width (i.e., the narrowest distance across the trench) in the range of 0.5 to 2.5 μm, while the width of the wide conduction region trenches is wider, such as in the range of 1.0 to 5.0 μm. Wide conduction region trenches 60 are formed within a perimeter of back isolation wall trenches to form the conduction region of the vertical power device. Notice that wide conduction region trenches 60 are wider than both front or back isolation wall trenches 48 and 46. Wide conduction region trenches 60 are preferably about twice as wide as back and front isolation wall trenches.

As mentioned above, both isolation wall trenches 46 and wide conduction region trenches 60 may be formed during the same etching operation. In comparison to the process of the first embodiment, this eliminates the need for an etching step (i.e., step 110) that is exclusively for forming the conduction region trenches. Combining steps saves time and reduces the cost of manufacturing the devices.

In the next step in FIG. 3, front isolation wall trenches are formed on the front surface of the semi-conductor substrate, as illustrated at block 204. FIG. 7 shows front isolation wall trenches 48 on front surface 44 of substrate 40.

The next step in the process of FIG. 3 is depositing P-type dopant to fill front and back isolation wall trenches, and to form a dopant layer on the walls of the wide conduction region trenches, as illustrated at block 206. This step is preferably implemented with a deposition process, such as that used in blocks 106 and 112 of FIG. 2, discussed above.

The results of this step are shown in FIG. 8, where substrate 40 is covered on front and back surfaces 44 and 42 by a layer of deposited P-type dopant 62. P-type dopant 62 has also filled front and back isolation wall trenches 48 and 46. It is important to note that wide conduction region trenches 60 are not completely filled with P-type dopant 62, but rather the walls of wide conduction region trenches 60 are coated with a layer of P-type dopant 62, leaving an opening 64 into wide conduction region trenches 60.

Figure 9:
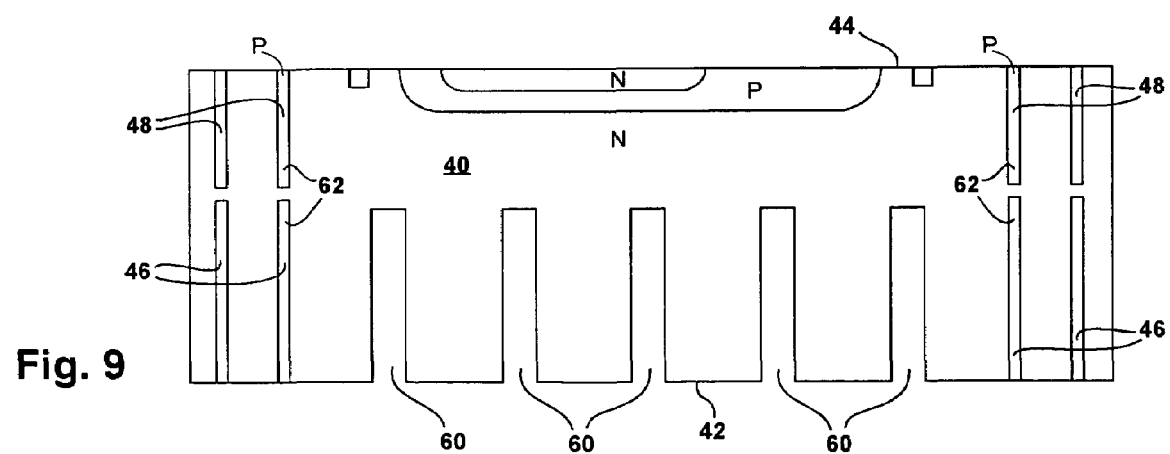

In the next step of the process, the P-type layer is etched from the front and back surfaces of the substrate, and from the walls of wide conduction region trenches, as depicted at block 208 in FIG. 3. This etching step, which is preferably an isotropic etching process, leaves the substrate as shown in FIG. 9, with front and back surfaces 44 and 42 etched down to the substrate material, with front and back isolation wall trenches 48 and 46 remaining filled with P-type dopant, and with the layer of P-type dopant etched from the walls of wide conduction region trenches 60. P-type dopant can be removed from wide conduction region trenches 60 because wide conduction region trenches 60 are wider, and because the P-type layer of dopant only coats the side walls of the trenches, leaving an opening 64 so that the etching process can remove the P-type dopant layer.

After removing the P-type layer of dopant, the next step in the process is to deposit N-type dopant to fill the wide conduction region trenches, as illustrated in block 210 of FIG. 3. In this step, an N-type dopant, which is preferably N-doped poly silicon, is deposited using a well known deposition process, such as the process disclosed above with reference to block 106 in FIG. 2. The deposited N-type dopant should completely fill wide conduction region trenches 60.

Figure 10:
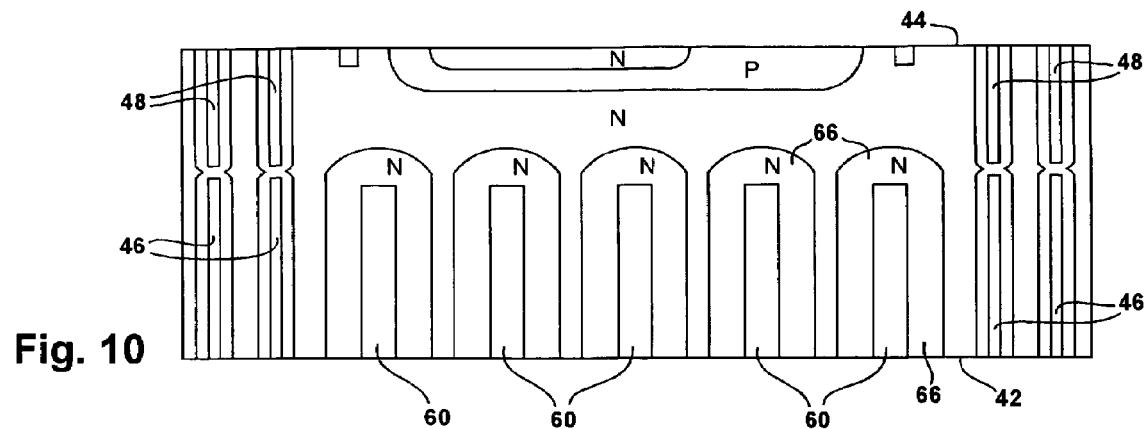

Next (or following the diffusion step below), the N-type dopant layer is removed from at least part of the front and back surfaces of the substrate, as depicted at block 212. The result of this step is best illustrated in FIG. 10, wherein wide conduction region trenches 60 are filled with N-type dopant, and the N-type dopant, has been removed from back surface 42 and front surface 44. (Note that the front and back surface of the wafer may have a dielectric layer or dielectric sandwich present.)

If some N-type dopant is left on back surface 42 of substrate 40, with no dielectric present, it will dope the horizontal back surface of the wafer N⁺ also.

In the next step, the N- and P-type dopants are diffused in the substrate to form the isolation wall and the conduction region, as illustrated in block 214. The affect of this diffusion step is shown in FIG. 10, wherein. conduction region diffused regions 66 extend outward from wide conduction region trenches 60, and wherein diffused regions 52 extend outward from isolation wall trenches 46 and 48.

While there are typically other steps needed to complete the fabrication of a vertical power device, and such additional steps may be interspersed in the flowchart of FIG. 3, the steps of this second embodiment of the present invention end at block 216.

Referring now to FIG. 4, there is depicted yet another embodiment of the present invention for manufacturing a vertical power device on a semi-conductor substrate. As illustrated, the process begins at block 300, and thereafter passes to block 302, wherein back isolation wall trenches and wide conduction region trenches are formed on the back surface of the semi-conductor substrate. This step is similar to step 202 in FIG. 3. The results of this step may be seen in FIG. 7, wherein back surface 42 includes back isolation wall trenches 46 and wide conduction region trenches 60.

Next, front isolation wall trenches are formed on the front surface of the substrate, as illustrated at block 304. The results of this step may be seen in FIG. 7 wherein front isolation wall trenches 48 are formed in front surface 44.

In the next step, P-type dopant is deposited to fill front and back isolation wall trenches, and to form a layer on the walls of the wide conduction region trenches, as depicted at block 306. The P-type dopant is preferably P-doped poly silicon. The thickness of this deposition is selected to full narrow isolation wall trenches, an not fill wide conduction region trenches. The results of this step may be seen in FIG. 8, wherein narrow front and back isolation wall trenches 48 and 46 are filled with P-type dopant, and the walls of wide conduction region trenches 60 are coated with a layer 62 of P-type dopant, leaving an opening 64 into wide conduction region trenches 60.

Figure 11:
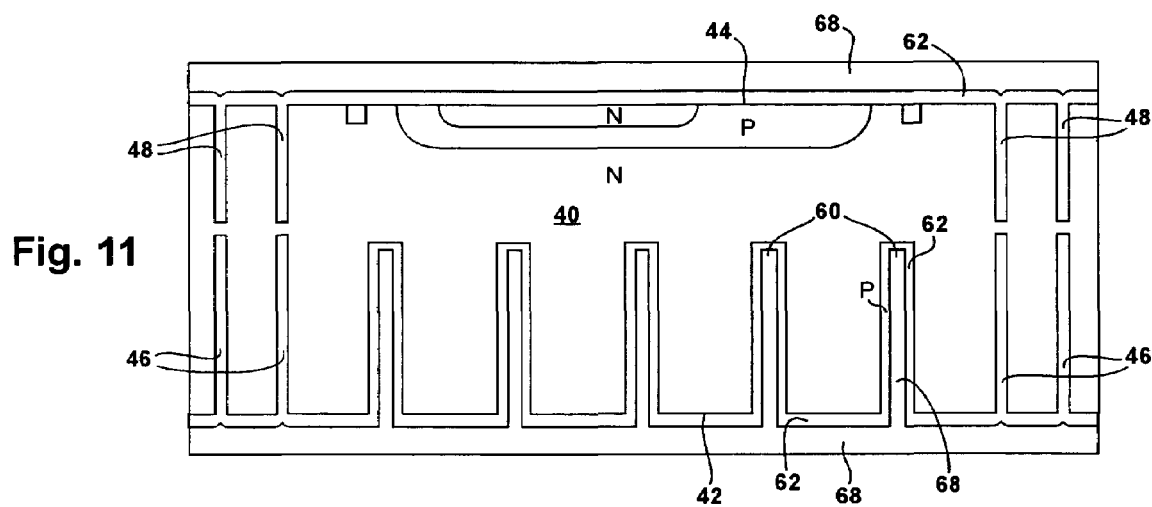
FIGS. 11-12 are simplified cross-section of views a vertical power device in various stages of manufacturing in accordance with the third embodiment of the present invention.

In the next step of the process of FIG. 4, N-type dopant is deposited to fill the opening in the wide conduction region trenches, as illustrated at block 308. The N-type dopant is preferably N-doped poly silicon with a dopant concentration greater than the concentration of the P-type dopant used in step 306. The result of this step is shown in FIG. 11, wherein N-type dopant 68 has filled openings 64 (See FIG. 8) so that wide conduction trenches 60 includes a layer of P-type dopant 62 on the walls of the trenches, and the remaining portion of wide conduction region trench 60 is filled with N-type dopant 68. Thus, N-type dopant is deposited to fill an unfilled portion of the wide conduction region trenches that is defined by the exposed outer surface of the layer of P-type dopant on the walls of the wide conduction region trenches.

The concentration of N-type dopant 68 is greater than the concentration of P-type dopant 62 so that during diffusion the N-type dopant 68 will more than compensate for the presence of P-type dopant 62 as the N-type dopant diffuses into the P-type poly silicon dopant and into the single crystal silicon of substrate 40.

After depositing the N-type dopant, both the N- and P-type dopants are etched from at least part of the front and back surfaces of the substrate, as illustrated at block 310 in FIG. 4. This etching process is preferably a wet or a plasma etching process. The result of this step is best illustrated in FIG. 12, wherein front and back surfaces 44 and 42 are etched free of dopant, isolation wall trenches 46 and 48 remain filled with P-type dopant, and wide conduction region trenches 60 are filled with a P-type dopant layer along the walls, and an N-type dopant filling the remaining portion of the trench. (Note that the front and back surfaces of the wafer may have a dielectric layer or a dielectric sandwich present.)

The next step in the process of FIG. 4 is diffusing the N- and P-type dopants to form the isolation wall and the conduction region, as depicted at block 312. As shown in FIG. 12, this step creates the isolation wall diffused regions 52 and the conduction region diffused regions 56. Although wide conduction region trenches 60 contain a layer of P-type dopant 62, diffused regions 56 have an N conductivity type because the N-type dopant in the wide trenches 60 has a higher concentration, and is thus able to overcome the effects of the P-type dopant.

Although there are typically several other steps needed to complete the fabrication of a vertical power device, and such additional steps may be interspersed in the flowchart of FIG. 3, the steps of this third embodiment of the present invention end at block 314.

As noted in the previous process flows, regions of the front or back surface may be doped either P-type or N-type if the appropriately doped layer (or sandwich, if N-type is over P-type) is left in contact with unprotected regions of the wafer.

While in a preferred embodiment, front and back isolation wall trenches 46 and 48 are continuous trenches, the trenches need not be continuous. In other embodiments, the trenches may be segmented, or comprise a series of holes or short segments. The advantage of using segmented trenches is that the wafer is stronger, which prevents wafers from breaking or warping.

Figure 14:
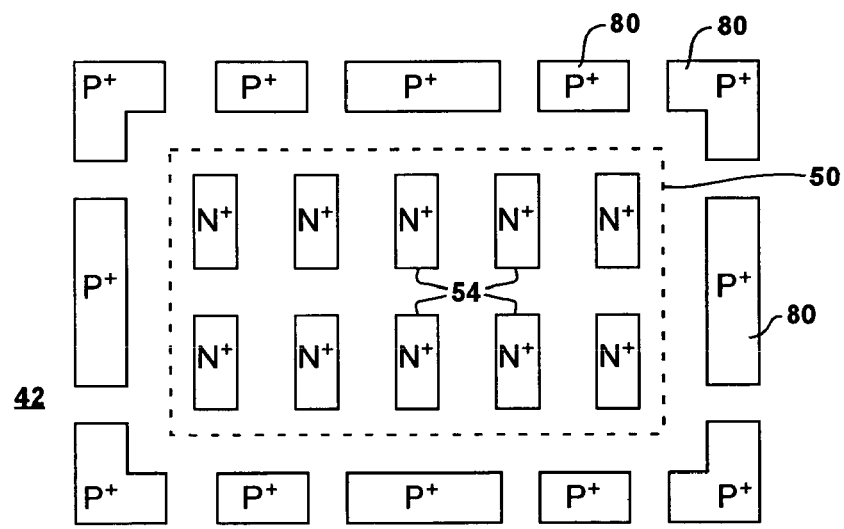
Figure 15:
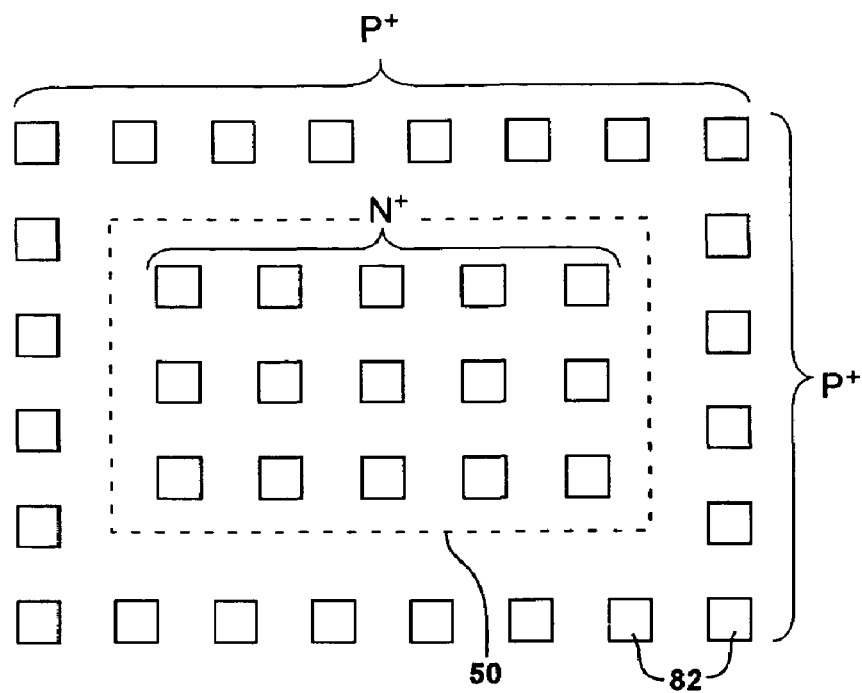

Segmented trenches 80 are shown in FIG. 14. FIG. 15 shows an isolation wall trench comprising a series of holes 82. Holes 82 forming the isolation wall may be repeated or staggered around the outside of a first set of holes so that more than one concentric series of holes surrounds active region 50. When the isolation wall trench is segmented, steps that diffuse dopants from segmented isolation wall trenches should be conducted for times and at temperatures that allow diffusing regions to join or intersect vertically and laterally to close gaps between trenches on the same side of the substrate and on opposite sides of the substrate.

Figure 16:
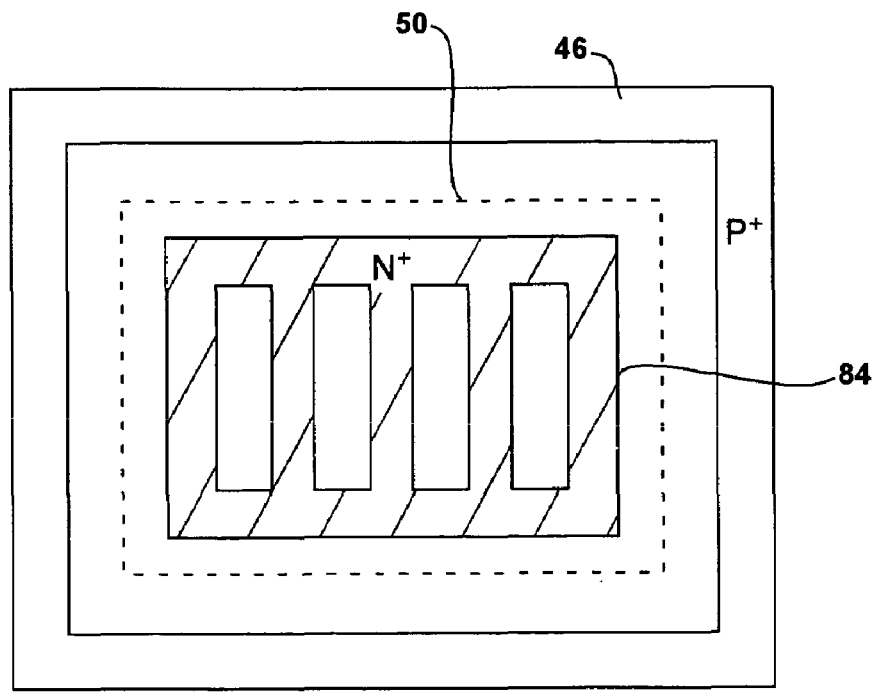

FIG. 16, shows an alternative N$^+$ conduction region trench 84 that is a combination of a trench in the shape of a rectangular frame that is traversed by three additional trenches extending across the frame.

The processes described above typically use plasma etching to form the trenches. Another known process that may be used to form a trench is wet etching.

In an alternate embodiment, the depths of the isolation wall trenches can overlap. Also, the isolation wall trenches may form holes that pass all the way through the substrate. If trenches pass through the substrate, the process for filling the trenches with dopant must be modified.

Persons skilled in the art should appreciate that the embodiments of the present invention provide isolated vertical power devices, and methods of making same, where the devices have low resistance paths to the back of the semiconductor substrate, and wherein epitaxial etching is not required. The second and third embodiments (see FIGS. 3 and 4) etch both the isolation wall trenches and the conduction region trenches on the back surface of the wafer at the same time, which saves time and reduces manufacturing costs. In the third embodiment (see FIG. 4), both excess P- and N-type dopants on the front and back surfaces of the wafer are etched away at the same time, which saves time and reduces manufacturing costs.

The foregoing description of a preferred embodiment of the invention has been presented for the purpose of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for manufacturing an isolated vertical power device in a semiconductor substrate, the method comprising the steps of:
   forming, in a front surface of the substrate having a first conductivity type, one or more front isolation wall trenches, wherein the front isolation wall trenches surround a perimeter of a conduction region of the vertical power device;
   forming, in a back surface of the substrate, one or more back isolation wall trenches surrounding the perimeter of the conduction region of the vertical power device;
   depositing a film containing a dopant of a second conductivity type into the front and back isolation wall trenches;
   forming, in the conduction region on the back surface of the substrate, one or more conduction region trenches, wherein the conduction region trenches are located within a perimeter of the front and back isolation wall trenches;
   depositing a film containing a dopant of the first conductivity type into the conduction region trenches; and
   diffusing the dopants from the conduction region trenches and from the front and back isolation wall trenches into the substrate to form a conduction region structure of the first conductivity type and an isolation wall of the second conductivity type.

2. The method of claim 1 further comprising the step of removing films containing the dopants of the first and second conductivity types from at least part of the front and back surfaces of the substrate prior to diffusing the dopants.

3. The method of claim 1, wherein the step of diffusing the dopants from the conduction region trenches and from the front and back isolation wall trenches further includes diffusing the dopants from the conduction region trenches and from the front and back isolation wall trenches under conditions that permit a diffused region from a selected front isolation wall trench to intersect with a diffused region from a selected back isolation wall trench to form an isolation wall of the second conductivity type.

4. The method of claim 1, wherein the steps of forming front and back isolation wall trenches further includes the steps of forming front and back isolation wall trenches using a plasma etching process.

5. The method of claim 1, wherein the step of forming the one or more conduction region trenches further includes forming one or more conduction region trenches having widths greater than widths of the front and back isolation wall trenches.

6. The method of claim 1 further comprising the step of forming a dielectric layer on the front and back surfaces of the wafer before forming a front or back isolation wall trench, or a conduction region trench.

7. A method for manufacturing an isolated vertical power device in a semiconductor substrate, the method comprising the steps of:

forming, in a front surface of the substrate, one or more front isolation wall trenches, wherein the front isolation wall trenches surround a perimeter of a conduction region;

forming, in a back surface of the substrate having a first conductivity type, one or more back isolation wall trenches surrounding the perimeter of the conduction region of the vertical power device, wherein a width of the front isolation wall trenches is substantially the same as a width of the back isolation wall trenches;

forming, in the back surface of the substrate, one or more wide conduction region trenches located within a perimeter of the back isolation wall trenches, wherein a width of the wide conduction region trenches is greater than a width of the back isolation wall trenches;

depositing a film containing a dopant of a second conductivity type to fill the front and back isolation wall trenches, and to form a layer on walls of the wide conduction region trenches;

removing the dopant of the second conductivity type from the front and back surfaces of the wafer, and from the walls of the wide conduction region trenches;

depositing a film containing a dopant of the first conductivity type to fill the wide conduction region trenches; and diffusing the dopants from the conduction region trenches, and from the front and back isolation wall trenches, into the semiconductor substrate to form a conduction region structure of the first conductivity type and an isolation wall of the second conductivity type.

8. The method of claim 7 further including the step of removing the dopant of the first conductivity type from at least part of the front surface and the back surface of the wafer prior to diffusing the dopants.

9. The method of claim 7, wherein the steps of forming one or more back isolation wall trenches and forming one or more wide conduction region trenches is performed during a single etching process.

10. The method of claim 7, wherein the steps of forming front and back isolation wall trenches, and forming conduction region trenches further includes the steps of forming front and back isolation wall trenches, and forming conduction region trenches using a plasma etching process.

11. The method of claim 7, wherein the step of forming conduction region trenches further includes forming conduction region trenches that have a width that is at least two times a width of the back isolation wall trenches.

12. The method of claim 7, wherein the step of depositing a dopant of a second conductivity type further includes depositing a dopant of a second conductivity type to form a layer on walls of the wide conduction region trenches and thereby leave an opening into the wide conduction region trenches.

13. The method of claim 7 further comprising the step of forming a dielectric layer on the front and back surfaces of the wafer before forming a front or back isolation wall trench, or a conduction region trench.

14. The method of claim 13, wherein the step of removing the layer of dopant of the second conductivity type from the front and back surfaces of the wafer further includes removing the layer of dopant of the second conductivity type from the dielectric layer on the front and back surfaces of the wafer.

15. A method for manufacturing an isolated vertical power device in a semiconductor substrate, the method comprising the steps of:

forming, in a front surface of the substrate, one or more front isolation wall trenches, wherein the front isolation wall trenches surround a perimeter of a conduction region;

forming, in a back surface of the substrate having a first conductivity type, one or more back isolation wall trenches surrounding the perimeter of the conduction region of the vertical power device, wherein a width of the front isolation wall trenches is substantially the same as a width of the back isolation wall trenches;

forming, in the back surface of the substrate, one or more wide conduction region trenches located within a perimeter of the back isolation wall trenches, wherein a width of the wide conduction region trenches is greater than a width of the back isolation wall trenches;

depositing a film containing a dopant of a second conductivity type to fill the front and back isolation wall trenches, and to form a layer on walls of the wide conduction region trenches;

depositing a film containing a dopant of the first conductivity type to fill a portion of the wide conduction region trenches defined by the layer of dopant of the second conductivity type on the walls of the wide conduction region trenches;

diffusing the dopants from the conduction region trenches, and from the upper and lower isolation wall trenches, into the semiconductor substrate to form a conduction region structure of the first conductivity type and an isolation wall of the second conductivity type.

16. The method of claim 15 further including the step of removing dopants of the first and second conductivity types from at least part of the front and the back surfaces of the substrate prior to diffusing the dopants.

17. The method of claim 15, wherein the steps of forming one or more back isolation wall trenches and forming one or more wide conduction region trenches is performed during a single etching process.

18. The method of claim 15, wherein the steps of forming front and back isolation wall trenches, and forming conduction region trenches further includes the steps of forming front and back isolation wall trenches, and forming conduction region trenches using a dry plasma etching process.

19. The method of claim 15, wherein the step of forming conduction region trenches further includes forming conduction region trenches that have a width that is at least two times a width of the back isolation wall trenches.

20. The method of claim 15, wherein the step of depositing a dopant of a second conductivity type further includes depositing a dopant of a second conductivity type to form a layer on walls of the wide conduction region trenches and thereby leave an opening into the wide conduction region trenches.

21. The method of claim 15 further comprising the step of forming a dielectric layer on the front and back surfaces of the wafer before forming a front or back isolation wall trench, or a conduction region trench.

22. The method of claim 21, wherein the step of removing the layer of dopant of the second conductivity type from the front and back surfaces of the wafer further includes removing the layer of dopant of the second conductivity type from the dielectric layer on the front and back surfaces of the wafer.

* * * * *